United States Patent [19]

Brackett et al.

[11] 4,109,217

[45] Aug. 22, 1978

[54] STABILIZATION CIRCUIT FOR JUNCTION LASERS

[75] Inventors: Charles Arthur Brackett, Summit; Richard Grant Smith, Basking Ridge, both of N.J.

[73] Assignee: Bell Telephone Laboratories, Incorporated, Murray Hill, N.J.

[21] Appl. No.: 749,357

[22] Filed: Dec. 10, 1976

[51] Int. Cl.$^2$ ............................................. H01S 3/10
[52] U.S. Cl. ............................ 331/94.5 S; 331/94.5 H
[58] Field of Search ...................... 331/94.5 S; 357/18, 357/19

[56] References Cited

U.S. PATENT DOCUMENTS

| 3,946,335 | 3/1976 | DeLoach, Jr. et al. | 331/94.5 S |
| 3,996,526 | 12/1976 | d'Auria et al. | 331/94.5 S |

Primary Examiner—William L. Sikes
Attorney, Agent, or Firm—Michael J. Urbano

[57] ABSTRACT

Described is a stabilization circuit for reducing the sensitivity of a junction laser to variations in the amplitude of drive current pulses. The circuit comprises a transistor connected in common emitter configuration, a junction laser connected between the collector and emitter, a photodetector connected between a voltage node and the emitter, a nonlinear element, such as a switching diode, connected between the node and the base, means for coupling a portion of the laser radiation to the photodetector, and means for coupling an input signal (e.g., current pulses) between the base and emitter. In one embodiment the photodetector is an avalanche photodiode to provide gain and the nonlinear element is a switching diode. In another embodiment the nonlinear element is a switching transistor to provide gain and the photodetector is a PIN photodiode.

4 Claims, 3 Drawing Figures

STABILIZATION CIRCUIT FOR JUNCTION LASERS

BACKGROUND OF THE INVENTION

This invention relates to circuits for stabilizing the output of lasers and, more particularly, to stabilizing the output of junction lasers to variations in the amplitude of drive current pulses.

As pointed out in U.S. Pat. No. 3,946,335 granted to B. C. DeLoach, Jr. and M. DiDomenico on Mar. 23, 1976, and assigned to the assignee hereof, the output power of a junction (diode) laser is known to vary as a function of temperature, natural aging and drive current. The latter is particularly important because of the ease with which catastrophic mirror damage occurs in junction lasers when the output power density exceeds the critical value. Because the catastrophic threshold can be exceeded as a result of spurious fluctuations in the amplitude of drive current pulses, it is important to reduce the sensitivity of the laser to such variations.

In the aforementioned patent, the output of a junction laser is stabilized by a negative feedback circuit in which a drive transistor is connected in common emitter configuration, the laser is connected between the collector and emitter, a photodetector is connected between the base and emitter and means couples a portion of the laser radiation to the photodetector. Photocurrent generated in the photodetector by the incident laser radiation reduces the base current, thus providing negative feedback. This circuit provides substantial immunity from changes in laser slope efficiency (to first order), threshold current, drive current and drive transistor gain. In addition, it is sufficiently fast acting to be capable of responding on a pulse-by-pulse basis in a digital system; that is, a system in which the drive current is a stream of encoded current pulses (PCM). On the other hand, this circuit does not lower the sensitivity of the laser to variations in amplitude of drive current pulses on a percentage overshoot basis which is most apt to be the case in a pulse circuit. That is, it is more likely that the percentage overshoot of pulse amplitude will be constant as the total current is changed rather than that the magnitude of the overshoot will be a constant. In addition, the D&D (DeLoach & DiDomenico) circuit improves sensitivity by lowering the slope of the L-I curve above threshold which presents two potential problems: (1) to get relatively high level light output high drive currents are required, but such high currents may not be within the capability of the drive circuit; and (2) the laser transition through threshold is more gradual so that the on-off (bistable) states are less clearly defined.

It is, therefore, an object of the present invention to provide all of the advantages attendant the stabilization circuit of D&D and, in addition, to reduce the sensitivity of the junction laser both to variations in the absolute amplitude of drive current pulses as well as variations on a percentage of overshoot basis.

It is another object of our invention to reduce the drive current required to generate a given light output level.

It is a further object of our invention to provide clearly defined bistable states for laser operation.

SUMMARY OF THE INVENTION

In accordance with an illustrative embodiment we employ in the negative feedback loop of the aforementioned D&D circuit a nonlinear element which acts as a light limiter to more clearly define bistable operation and effectively reduce the sensitivity of the laser to variations in drive current amplitude, both on an absolute basis as well as on a percentage of amplitude overshoot basis. Our stabilization circuit comprises a transistor connected in common emitter configuration, a junction laser connected between the collector and emitter, a photodetector connected to the emitter, means for coupling a portion of the radiated output of the laser to the photodetector and means for coupling an input signal between the base and emitter, characterized in that a nonlinear element is connected between a voltage node of the circuit and the base and the photodetector is connected between the same node and the emitter.

In a specific exemplary embodiment, the photodetector is an avalanche photodiode (APD) to provide gain and the nonlinear element is a switching diode. In another such embodiment the nonlinear element is a transistor to provide gain and the photodetector is a PIN photodiode.

BRIEF DESCRIPTION OF THE DRAWING

These and other objects of our invention, together with its various features and advantages, can be readily understood from the following more detailed description taken in conjunction with the accompanying drawing, in which.

DETAILED DESCRIPTION

Figure 1:
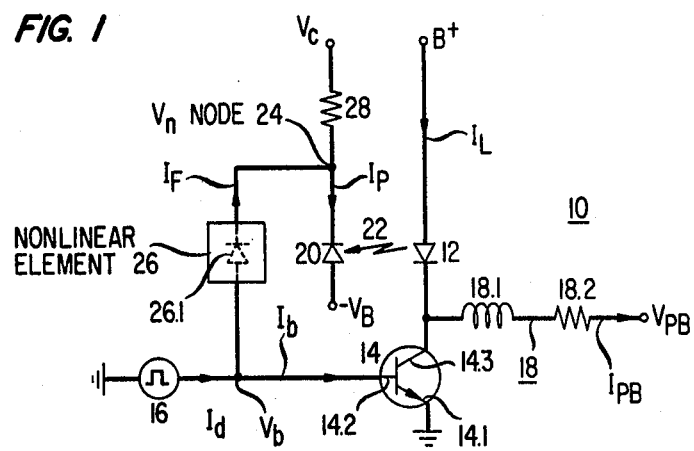
FIG. 1 is a circuit diagram of one embodiment of our invention using a switching diode and an APD in the feedback loop.

With reference now to FIG. 1, we show a schematic of a stabilization circuit 10 in accordance with one embodiment of our invention for reducing the sensitivity of a junction laser 12 to variations in the amplitude of drive current both on an absolute basis and on a percentage of overshoot basis, and for producing more clearly defined bistable operation. The embodiment of FIG. 1 comprises a drive transistor 14 which has emitter 14.1, base 14.2 and collector 14.3 electrodes and which is connected in a common emitter configuration; that is, for the npn transistor shown drive current is provided by pulsed current source 16 connected (on an a.c. basis) between the base 14.2 and emitter 14.1, and the collector 14.3 is connected to a more positive voltage (B+) than the emitter 14.1 (at ground). Of course a pnp transistor could also be used and then one would simply reverse voltage polarities. In either case a junction laser 12 is connected (on an a.c. basis) between collector 14.3 and emitter 14.1 and a prebias circuit 18, including an inductor 18.1 and a resistor 18.2 connected in series between the collector 14.3 and a voltage source $V_{PB}$, maintain a minimum bias current $I_{PB}$ flowing through laser 12. The prebias current, which is less than the threshold current for lasing, is provided so as to reduce the laser turn-on time. This embodiment of our invention is characterized in that a photodetector 20, optically coupled to laser 12 by means designated by arrow 22 and well known in the art, is connected (on an a.c. basis) between a voltage node 24 (at voltage $V_n$) and the emitter 14.1, and a nonlinear element 26 is connected between node 24 and base 14.2. Illustratively, photodetector 20 is shown as a reverse biased photodiode (e.g., a PIN photodiode) and element 26 is shown as a switching diode 26.1. On a d.c. basis, both the photodiode and the switching diode have their cathodes connected to node 24 which in turn is connected through resistor 28 to a positive voltage source $V_c$. On the other hand, the anode of the switching diode 26.1 is connected to the base 14.2 whereas the anode of the photodiode 20 is connected to a negative voltage source $-V_B$.

In operation, consider first the case in which the laser 12 has no radiation (light) output. Then, $V_n = V_c > V_b$ so $I_F = 0$ and the circuit operates as if no feedback were present. This condition exists up past the lasing threshold to a point where $V_b - V_n \geq V_t$, the threshold turn-on of the switching diode 26.1. Above that point the analysis of circuit operation is as follows. The laser begins to lase when the current flow through it equals or exceeds the threshold $I_T$; that is, when $$\beta I_b + I_{PB} = I_T \tag{1}$$

or $$I_b = (I_T - I_{PB})/\beta \tag{2}$$

where $\beta$ is the transistor emitter-base current gain, $I_b$ is the base current and $I_{PB}$ is the prebias current.

Next, the photocurrent $I_p$ in the photodetector 20 is given by $$I_p = KfL = Kf\eta (I_L - I_T) \tag{3}$$

where $L$ is the light output of the laser 12 (in units of current) $f$ is the fraction of the laser output radiation which is coupled into the photodetector 20, $K$ is the quantum efficiency of the photodetector, and $\eta$ is the quantum efficiency of the laser. The critical photocurrent $I_p^{crit}$ required to turn on the switching diode 26.1 is derived thusly;

$$V_n = V_c - I_p R \tag{4}$$

But, the switching diode turns on when $$V_b - V_n = V_t \tag{5}$$

So, substituting Eq. (5) into Eq. (4) and solving, we get $$I_p^{crit} = \frac{V_c - (V_b - V_t)}{R} \tag{6}$$

or, using Eq. (3), $$I_p^{crit} = KfL_{crit} \tag{7}$$

and $$L_{crit} = I_p^{crit}/Kf \tag{8}$$

which is the light level at which the laser switches the feedback loop on. Prior to that point being reached, however, $$L = \eta(I_L - I_T) = \eta(\beta I_d - I_T) \tag{9}$$

where $I_d$ is the current from drive source 16 and $I_L$ is the collector current flowing through laser 12. At the onset of lasing $$L = L_{crit} = \eta (I_L^{crit} - L_T) \tag{10}$$

and $I_F = 0^+$, so $I_b = I_d$ and $$I_L^{crit} = \beta I_d^{crit} + I_{PB} \tag{11}$$

Therefore, $$L_{crit} = \eta (\beta I_d^{crit} + I_{PB} - I_T) \tag{12}$$

or $$\frac{L_{crit}}{\eta \beta} + \frac{I_T - I_{PB}}{\beta} = I_d^{crit} \tag{13}$$

Above $I_p^{crit}$ given by Eq. (6), virtually all of the photocurrent flows through the switching diode 26.1 because $V_b$ is held at a constant voltage by the junction characteristic of diode 26.1. Therefore, for $L > L_{crit}$ $$I_F = I_p - I_p^{crit} \tag{14}$$

Substituting Eq. (3) for $I_p$ and Eq. (7) for $I_p^{crit}$ into Eq. (14), we get $$I_F = Kf\eta(I_L - I_T) = KfL_{crit} \tag{15}$$

In order to obtain $L$ in terms of $I_d$ only we return to Eq. (9)

$$L = \eta(I_L - I_T) \tag{9}$$

and substitute as follows $$I_L = \beta I_b + I_{PB} \tag{16}$$

$$I_L = \beta(I_d - I_F) + I_{PB} \tag{17}$$

Now, we substitute Eq. (15) into Eq. (17) and solve for $I_L$ which, in turn, is substituted into Eq. (9) to give, after some manipulation, $$L = \frac{\eta \beta I_d}{1 + \beta Kf\eta} - \left[ \eta \frac{(I_T - I_{PB}) - \beta KfL_{crit}}{1 + \beta Kf\eta} \right] \tag{18}$$

But, using Eq. (13), we substitute for $(I_T - I_{PB})$ to arrive at $$L = \frac{\eta \beta (I_d - I_d^{crit})}{1 + \beta Kf\eta} + L_{crit}, \tag{19}$$

remembering that Eq. (19) holds for $L > L_{crit}$, the light output which turns on the switching diode 26.1.

Assuming that the loop gain $\beta Kf\eta \gg 1$, we have plotted Eq. (19) on FIG. 3 as lines I and II. Line I (slope $\eta \beta$) by itself is characteristic of a junction laser connected across the collector and emitter of a transistor but without feedback. Line III (slope $\eta < 1$) is characteristic of the laser with neither transistor drive nor feedback, and line IV (slope $1/Kf$) is characteristic of the D&D feedback stabilization circuit. Several observations can be made from FIG. 3. First, the slope with either our circuit or that of D&D is $1/Kf$ and thus is proportional to the gain of the feedback loop. To lower the slope, gain can be inserted into the loop by means of another transistor (FIG. 2 to be discussed hereinafter) or preferably by using an APD for photodetector 20. In doing so, however, care should be exercised to avoid feedback instabilities which may occur if the dominant pole of the feedback loop is at too high a frequency, as discussed hereinafter. Second, in the case of D&D (line IV) $Kf$ is limited by the maximum amount of current which can be used to drive the transistor, which in practice limits the shallowness of the slope of line IV. In contrast, in our invention (line II) the larger $Kf$ the better. In the limit as $Kf$ approaches infinity, from Eq. (6) the light output is given by $L_{crit} = I_p^{crit}/Kf$ or $$L = L_{crit} = \lim_{\text{large } Kf} \left[ \frac{V_c - (V_b - V_t)}{KfR} \right] \quad (20)$$

where R is resistor 28. Because $V_b$ and $V_t$ are fixed we get the result that $V_c \propto Kf$ or $$V_c = KfRL_o \quad (21)$$

where $L_o$ is the desired light output level. Equation (21) is useful in designing our circuit because it gives the voltage $V_c$ required to bias the switching diode. Moreover, we find that to get a flatter characteristic (lower slope of line II) we must either increase $V_c$ or lower R in addition to increasing the gain $Kf$. Note that an APD used for photodetector 20 also generates noise and, therefore, K is limited to some maximum value by requiring the noise current to be less than some specified value.

Figure 3:
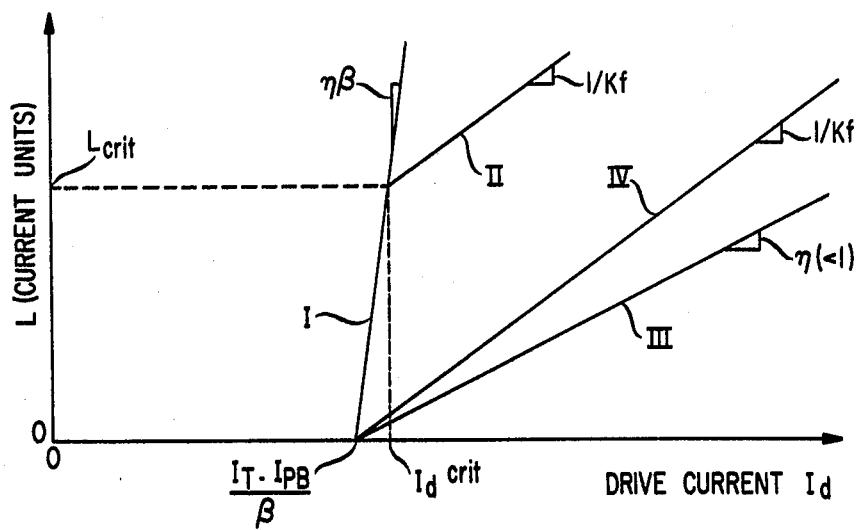
FIGS. 3 and 4 are graphs of light (radiation) output of the laser versus current used to explain the operation of our invention.
Figure 4:
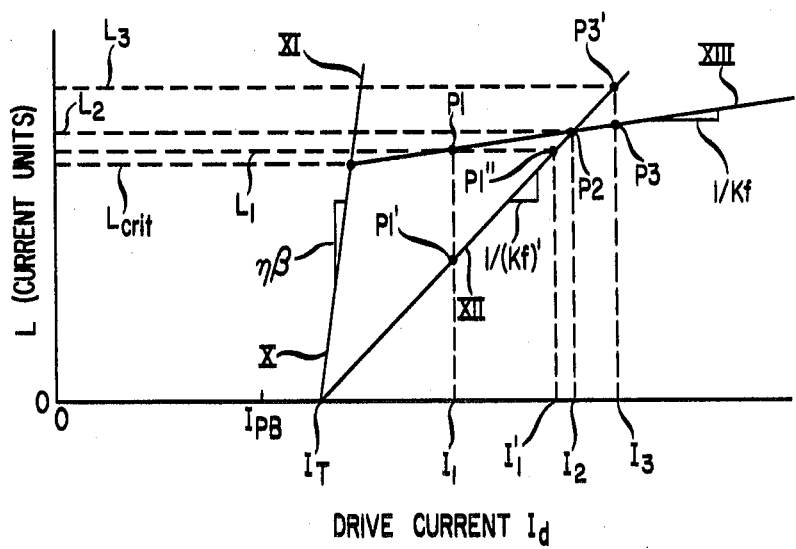

Note that the previous discussion of FIG. 3 assumed $Kf$ was the same for both circuits. But, the real attractiveness of our circuit is that it allows for K (i.e., equivalently the loop gain) to become large by using, for example, an APD for photodetector 20 or a transistor for nonlinear element 26. For an APD typical gains are 50 to 100, so the slope of the L-I curve above $L_{crit}$ goes down proportionally. Thus, whatever sensitivity that the D&D circuit achieves, our scheme improves this by a factor of 50 to 100. The L-$I_d$ curves then appear as shown schematically in FIG. 4 where lines X-XI are for a laser with transistor drive but without feedback, line XII is for the D&D circuit and lines X-XIII are for our circuit with gain in the feedback loop.

In practice our circuit would be designed so that $L_{crit}$ is below the desired light output $L_1$ and enough gain would be inserted in the feedback loop to decrease the slope of line XIII, thus resulting in a typical operating point P1 at drive current $I_1$. Several comparisons can be made: (1) Variations in the absolute amplitude of $I_d$ — because line XIII is so flat, at an operating point such as P1, changes in $I_1$ produce very little change in light output $L_1$ from our circuit, but produce much larger changes in L (at P1') for the D & D circuit; (2) variations in $I_d$ on a percentage overshoot basis — consider operation at the crossover pont P2 of lines XIII and XII where $L_2$ and $I_2$ are the same for both our circuit and that of D & D. If $I_2$ now changes in both circuits by, say, 10 percent to $I_3$, the operating point of our circuit changes to P3 but with very little change in L, whereas the operating point of D & D changes to P3' accompanied by a much larger increase to $L_3$; (3) Drive current level — below the cross-over point, where operation would typically occur at P1, a given light output level $L_1$ is achieved at a lower drive current $I_1$ in our circuit than the higher current $I_1'$ (at P1") required by the D & D circuit. Consequently, the capabilities of the drive circuit (i.e., the maximum deliverable drive current) place much less of a limitation on the maximum light output from our circuit; (4) Bistable operation — the threshold transition in our circuit starts at $I_{PB}$ and follows the steep slope of line X to operating point P1 on relatively flat line XIII, thus providing clearly defined on-off states. This bistable characteristic is a useful feature in digital systems. In contrast, in the D & D circuit the transition from $I_{PB}$ follows the much shallower line XII and, because it is more sensitive to parameter variations (drive current, temperature, etc.), then on-off states are less bistable in nature.

As mentioned previously, when inserting gain into the feedback loop care should be exercised so that the circuit does not become unstable. For example, assuming a single fundamental pole and a 30° phase margin, for loop gains of 10, 20, 50 and 100 the bandwidth of the circuit is approximately 40, 19.2, 7.5 and 3.7 MHz, respectively, for a loop time delay of 1 ns and 13.3, 6.4, 2.5 and 1.2 MHz for a loop time delay of 3 ns. If, on the other hand, a 10° phase margin can be tolerated, the bandwidth in each case increases by about 20 percent. It is conceivable, however, that a suitable nonlinear feedback scheme could be used to increase the bandwidth by making the rise time of the feedback loop a function of the bistable light state: i.e., a relatively long rise time in the on state to provide stability, but a short rise time in the transition between on and off states. In addition, since instability arises from the basic time delay of the feedback loop, which in turn is caused by the inherent characteristics of the various p-n junction devices, faster devices would also increase bandwidth.

Figure 2:
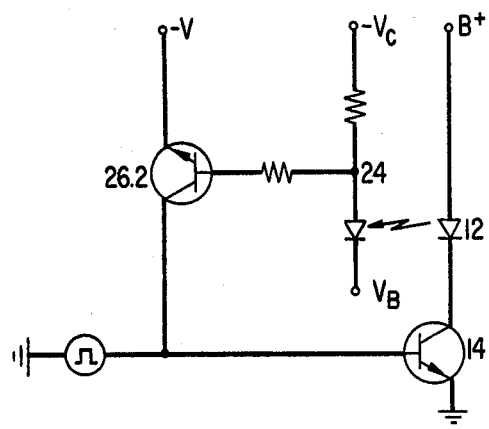
FIG. 2 is a circuit diagram of another embodiment of our invention using a transistor and a PIN diode in the feedback loop.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, gain can be inserted into the feedback loop as shown in FIG. 2 by means of an npn transistor 26.2 which serves as nonlinear element 26 of FIG. 1. Transistor 26.2 has its base resistively coupled to voltage node 24, its collector connected to the base of drive transistor 14 and its emitter connected to a source of negative voltage (ac ground, which is the same as the emitter of drive transistor 14). We have found that reversing the collector and emitter connections of transistor 26.2 is disadvantageous because it allows too much drive current to be diverted from the base of transistor 14, and may even turn off laser 12. Note, in FIG. 2 the photodiode has been reversed and so have the polarities of $V_C$ and $V_B$.

What is claimed is:

1. A stabilization circuit comprising a drive transistor connected in common emitter configuration and having emitter, base and collector electrodes; a junction laser coupled between said collector and emitter electrodes; a photodetector coupled to said emitter electrode; a portion of the radiated output from said laser being coupled to said photodetector; and means for coupling an input signal between said base and emitter electrodes; characterized in that:

said photodetector is coupled between a voltage node of said circuit and said emitter electrode; and a nonlinear rectifying junction element is coupled between said node and said base electrode.

2. The circuit of claim 1 wherein said nonlinear element is a switching diode and said photodetector is a photodiode.

3. The circuit of claim 1 wherein said photodiode is an avalanche photodiode.

4. The circuit of claim 1 wherein said photodetector is a photodiode and said nonlinear element is a control transistor having emitter, base and collector electrodes, its base electrode being coupled to said node, its collector electrode being coupled to said base electrode of said drive transistor and its emitter electrode being coupled to the emitter electrode of said drive transistor.

* * * * *